(12) United States Patent
Spinali (10) Patent No.: US 6,473,245 B1
(45) Date of Patent: Oct. 29, 2002

(54) CATADIOPTRIC LENS BARREL STRUCTURE HAVING A PLURALITY OF SUPPORT PLATFORMS AND METHOD OF MAKING THE SAME

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,068

(22) Filed: Aug. 10, 2000

(51) Int. Cl.$^7$ ................................................. G02B 7/02
(52) U.S. Cl. ....................................... 359/811; 359/819
(58) Field of Search ........................... 359/811, 819, 359/822, 823, 695, 703, 704; 353/100, 101

(56) References Cited

U.S. PATENT DOCUMENTS

| | | | |
|---|---|---|---|
| 3,722,996 A | 3/1973 | Fox | 355/53 |
| 4,733,945 A | 3/1988 | Bacich | 359/820 |
| 4,782,475 A | 11/1988 | Chandler | 369/44.15 |
| 4,961,115 A | 10/1990 | Jessop | 348/374 |
| 5,187,519 A | 2/1993 | Takabayashi et al. | 355/53 |
| 5,428,482 A | 6/1995 | Bruning et al. | 222/207 |
| 5,576,895 A | 11/1996 | Ikeda | 359/811 |
| 5,586,818 A | 12/1996 | Lee | 353/101 |
| 5,636,913 A | 6/1997 | Park | 353/101 |
| 5,708,534 A | 1/1998 | Park | 359/822 |
| 5,734,499 A | 3/1998 | Matsumoto et al. | 359/417 |
| 6,239,924 B1 | 5/2001 | Watson et al. | 359/819 |

FOREIGN PATENT DOCUMENTS

WO    WO99/27570    3/1999

*Primary Examiner*—Ricky Mack
(74) *Attorney, Agent, or Firm*—Finnegan Henderson Farabow Garrett & Dunner, L.L.P.

(57) ABSTRACT

A catadioptric lens barrel structure for a projection exposure apparatus includes first and second lens barrels, each having an optical axis which runs parallel to each other. The first and second lens barrels each have an optical pivot point. The lens barrel structure includes a transverse lens barrel connecting the first and second lens barrels. A reticle is placed in front of an entrance of the first lens barrels and a wafer is placed in front of an exit of the second lens barrel. The lens barrel structure further includes a support structure for supporting the plurality of lens barrels. The support structure is made of a material having a low coefficient of thermal expansion. The support structure firmly secures the first and second lens barrels near their corresponding optical pivot points to obtain maximum optical performance. Alternatively, the support structure may firmly secure the first and second lens barrels at their base portions to provide optimum structural support.

23 Claims, 9 Drawing Sheets

CATADIOPTRIC LENS BARREL STRUCTURE HAVING A PLURALITY OF SUPPORT PLATFORMS AND METHOD OF MAKING THE SAME

BACKGROUND OF THE INVENTION

1. Field of the Invention

This invention relates to a catadioptric lens barrel which can be attached to an optical projection unit, such as a projection exposure apparatus used to manufacture semiconductor wafers. More particularly, the present invention relates to a catadioptric lens barrel structure including its support structure, the lens barrel structure comprising a plurality of lens barrels aligned in parallel, and at least one transverse lens barrel connecting the plurality of lens barrels.

2. Description of the Related Art

A lens barrel is a tubular mechanical structure containing a series of lenses which are aligned to transfer an image from one end of the lens barrel to the other. The lens barrel may include a sturdy threaded body and durable metal retaining rings, often referred to as sub-barrels, to carry a series of lens holders, commonly referred to as cells. Another type of lens barrel is known as a catadioptric lens barrel. A catadioptric lens barrel contains not only refractive elements, such as lenses, but also reflective elements, such as mirrors.

Both of these lens barrel designs are used in conventional optical systems. For example, optical projection units often have a lens barrel and may be used in a projection exposure apparatus for production of semiconductor wafers. The projection exposure apparatus includes a reticle positioned near an entrance end of the lens barrel and a semiconductor wafer positioned near an exit end. The projection exposure apparatus shines light through the reticle, photographically reduces a pattern on the reticle, and sequentially transfers the pattern, through the lens barrel, onto a predetermined area on the semiconductor wafer. The semiconductor wafer is a silicon wafer with a photo-sensitive coating for making semiconductor devices, such as microprocessor or memory chips.

A catadioptric lens barrel system using two or more lens barrels, arranged in parallel, offers benefits not found in conventional single barrel systems. The parallelism of the lens barrels reduces the overall height of the lens barrel, but increases the overall width. Reduced height is important for many reasons, such as for ease of transport. This type of catadioptric lens barrel design, however, poses several problems. First, keeping proper alignment of a plurality of lens barrels can be difficult. Second, the focus depth of the projection system changes as temperature changes. Coefficients of thermal expansion of the lens barrels, including their internal components, and the indices of refraction of all lens materials vary with temperature. Errors related to these factors collectively alter the focusing properties of the optical system. Third, the lens barrel structure tends to be more sensitive to movement or vibration than conventional single barrel designs.

In light of the foregoing, there is a need for a catadioptric lens barrel structure that holds the lens barrels stably and accurately, and minimizes distortion errors due to temperature changes, vibrational, or other external forces, so that the resulting image remains focused as it is transferred and reduced from the reticle to the semiconductor wafer.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the principles of the invention, as embodied and broadly described herein, one embodiment of the invention is directed to a lens barrel structure comprising a plurality of lens barrels, a support structure for supporting the plurality of lens barrels, and a plurality sets of flexures for resiliently securing the plurality of lens barrels to the support structure.

The present invention is also directed to a lithography system such as for use in a semiconductor manufacturing including the lens barrel structure as described above.

The present invention is further directed to a method for making a lens barrel structure, comprising the steps of providing a plurality of lens barrels, providing a support structure for supporting the plurality of lens barrels, and providing a plurality sets of flexures for resiliently securing the plurality of lens barrels to the support structure.

A first aspect of the present invention is directed to a lens barrel support structure for use in a projection exposure apparatus for stabily holding the lens barrels. The plurality of lens barrels include first and second lens barrels. The first lens barrel has a length, a first optical axis along the length of the first lens barrel, and a first optical pivot point along the first optical axis near a reticle located at one end of the first lens barrel. Similarly, the second lens barrel has a length, a second optical axis along the length of the second lens barrel, and a second optical pivot point along the second optical axis near a wafer located at one end of the second lens barrel. The first and second optical pivot points determine the optically optimum locations to hold the first and second lens barrels, respectively, to minimize thermal and vibrational effects. The first and second optical pivot points are calculated according to a computerized analysis or are generated by computer modeling. The first and second optical axes run parallel to each other and define a frontal plane. A first optical plane is defined as a plane perpendicular to the frontal plane and passing through the first optical axis. A second optical plane is defined as a plane perpendicular to the frontal plane and passing through the second optical axis. The lens barrel support structure comprises upper and lower support platforms. For maximum control, the upper support platform firmly secures the first lens barrel substantially near the first optical pivot point, and the lower support platform firmly secures the second lens barrel substantially near the second optical pivot point. The upper support platform is perpendicular to the first and second optical axes. The upper support platform has openings that accommodate the lens barrels. A second set of flexures resiliently secure the second lens barrel to the upper support platform. Likewise, the lower support platform is parallel to the upper support platform. The lower support platform has openings that accommodate the lens barrels. A first set of flexures resiliently secure the first lens barrel to the lower support platform.

A second aspect of the present invention is also directed to a lens barrel structure for use in a projection exposure apparatus. The second aspect of the invention derives from a more practical design to result in a support structure that is sturdier and easier to build from a mechanical stand point. Because of their size and weight, the lens barrels are best supported around their base and upper portions. Similar to the first aspect of the invention, the plurality of lens barrels comprises first and second lens barrels. Each lens barrel has a length and an optical axis. The first and second optical axes run parallel to each other and define a frontal plane. A first optical plane is defined as a plane perpendicular to the frontal plane and passing through the first optical axis. A second optical plane is defined as a plane perpendicular to the frontal plane and passing through the second optical axis. The lens barrel support structure comprises a base support platform and an upper support platform. The base platform firmly secures base portions of the plurality of lens barrels. The base platform is perpendicular to the first and second optical axes. The base platform has openings to accommodate the lens barrels. The upper support platform is parallel to the base platform, and has a plurality of openings to accommodate the lens barrels. A plurality of sets of flexures resiliently secure the first and second lens barrels to the upper support platform.

It is to be understood that both the foregoing general description and the following detailed description are exemplary and explanatory only and are not restrictive of the invention as claimed.

Additional advantages will be set forth in the description which follows, and in part will be understood from the description, or may be learned by practice of the invention. The objects and advantages may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE PREFERRED EMBODIMENT

Reference will now be made in detail to the present embodiments of the invention, examples of which are illustrated in the accompanying drawings. Wherever possible, the same reference numbers will be used throughout the drawings to refer to the same or like parts. The invention will be further clarified by the following examples, which are intended to be exemplary of the invention.

Generally, a catadioptric lens barrel structure is provided with a plurality of lens barrels and a support structure. The support structure is configured to provide enhanced stability and is made out of materials that reduce the effects of environmental changes on the lens barrel structure. The lens barrels run parallel to each other. In a first embodiment, each lens barrel has an optical axis and an optical pivot point positioned along the corresponding optical axis. To minimize both thermal and vibrational effects, the support structure supports each of the lens barrel substantially near the corresponding pivotal optical axis. The first embodiment offers an optimum support structure from an optical stand point because the support structure can optimally control movements of the lens barrels due to thermal and vibrational effects.

In a second embodiment, the support structure is sturdier and easier to construct from a mechanical stand point. Because the lens barrels are normally large and heavy, the support structure in the second embodiment firmly supports the lens barrels around their base portions. The support structure comprises a base support platform and an upper support platform. The base support platform firmly supports base portions of the lens barrels. A plurality of flexures resiliently secure upper portions of the lens barrels to the upper support platform. The lens barrels have a configuration similar to the first embodiment.

Specifically, in accordance with a first aspect of the invention, a catadioptric lens barrel structure is provided with a plurality of lens barrels. Each lens barrel has an optical axis running along its length. The optical axes run parallel to each other and define a frontal plane. Each lens barrel also has an optical pivot point at which the lens barrel is controlled to minimize thermal and vibrational effects. These optical pivot points are calculated according to a computerized analysis or are generated by computer modeling.

Figure 1:
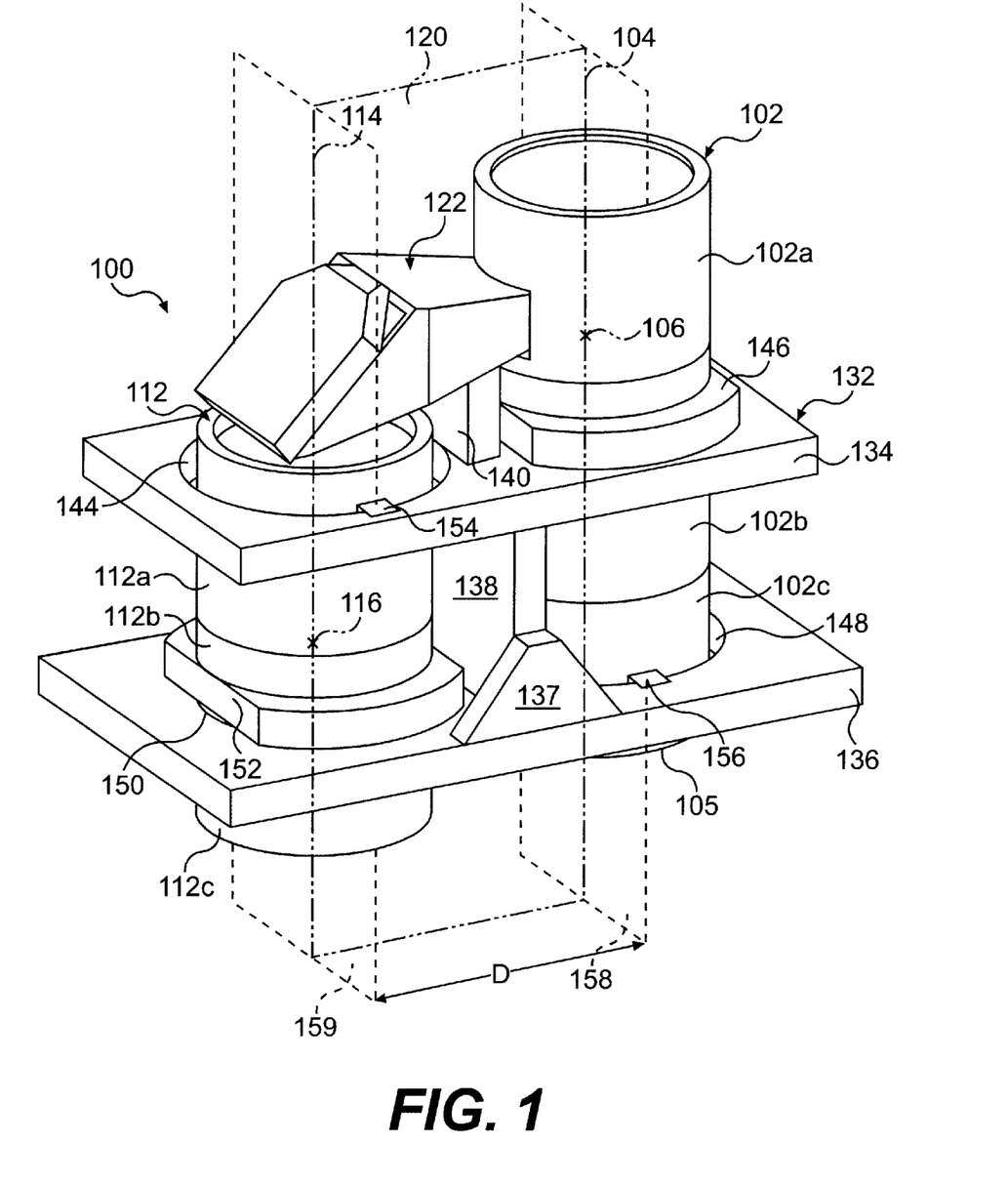
FIG. 1 is a perspective view of a catadioptric lens barrel structure according to a first embodiment of the present invention.

In a first embodiment, as illustrated in FIG. 1, a catadioptric lens barrel structure 100 comprises, for exemplary purposes, a pair of lens barrels including a first lens barrel 102 and a second lens barrel 112. First lens barrel 102 has a first optical axis 104 running along its length and a first optical pivot point 106 near a reticle (shown in FIG. 3). Second lens barrel 112 has a second optical axis 114 running along its length and a second optical pivot point 116 near a semiconductor wafer (shown in FIG. 3). The reticle and semiconductor wafer will be discussed in greater detail below with respect to FIG. 2. The first and second optical axes 104, 114, run parallel to each other and define an imaginary frontal plane 120.

First and second lens barrels 104, 114 can be made of a rigid material, such as stainless steel or silicon carbide.

Some examples include stainless steel commonly known in the industry as SS 17-7PH, SS 440 series, or SS 300 series. In a semiconductor production environment, first lens barrel 102 is normally quite large and heavy, and may be as large as one meter (approximately 40 inches) in length, slightly less than a half meter (approximately 16 inches) in diameter, and weighing almost 500 kilograms (approximately 1100 pounds).

First and second lens barrel 102, 112 may be constructed of several different types of lens barrels. A first type of lens barrel carries a plurality of lens holders (commercially known as cells), on which lenses are mounted. The plurality of lens holders are stacked in a serial orientation along the optical axis of the lens barrel. Another type of lens barrel comprises a series of sub-barrels connected end to end by fasteners. FIGS. 1, 3, 4, and 5 show first and second lens barrels 102, 112 as the sub-barrel type, first lens barrel 102 comprising sub-barrels 102a, 102b, and 102c; and second lens barrel 112 comprising sub-barrels 112a, 12b, and 112c.

Consistent with the principles of the invention, a catadioptric lens barrel structure is provided with at least one transverse lens barrel. The number of transverse lens barrels equals to the number of lens barrels minus one. The transverse lens barrels connect one of the plurality of lens barrels to the next successive lens barrel. Each transverse lens barrel includes at least a pair of reflective elements. The reflective elements are angularly oriented to reflect an image from the reticle from one of the plurality of lens barrels to the next successive lens barrel. The image ultimately is reflected through the lens barrels onto the semiconductor wafer in front of an exit end of the last lens barrel.

Figure 2:
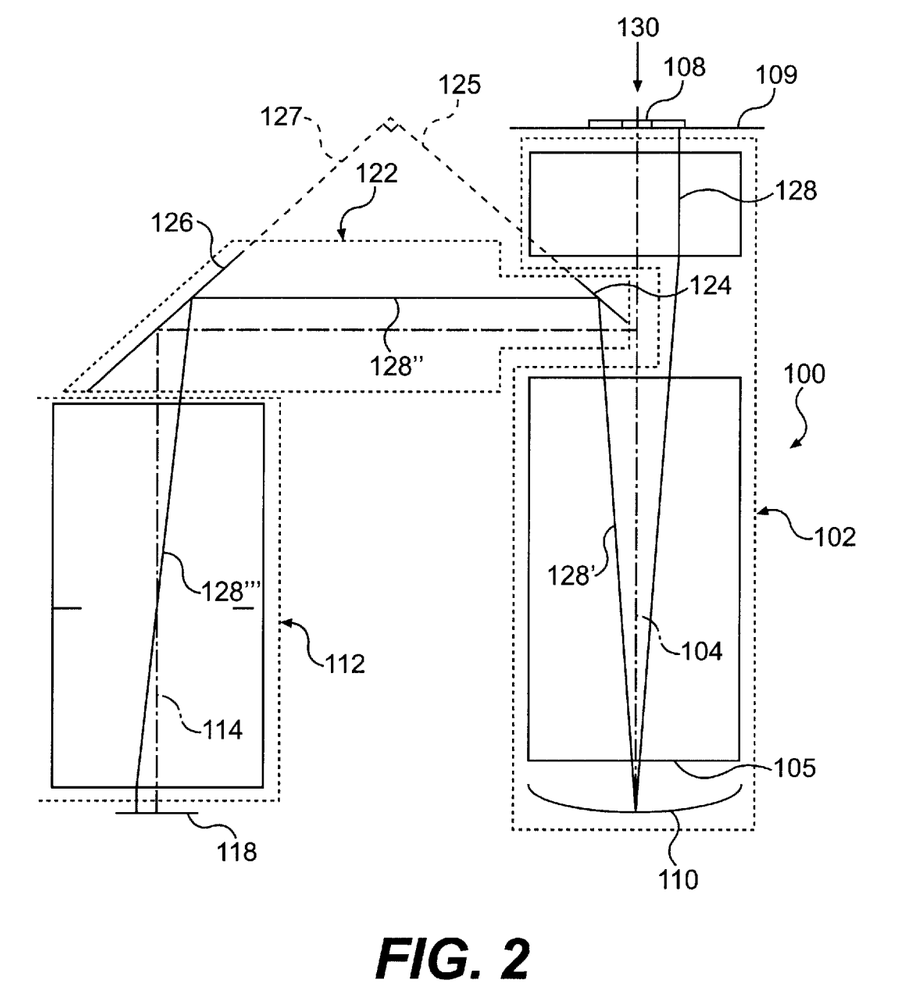
FIG. 2 is a schematic diagram of the catadioptric lens barrel structure according to the first embodiment of the present invention illustrating light path passing through the lens barrel structure.

As shown in FIG. 1, catadioptric lens barrel structure 100 includes, for exemplary purposes, a transverse lens barrel 122 connecting first lens barrel 102 to second lens barrel 112. Transverse lens barrel 122 carries therein a pair of mirrors (not shown). As best shown in FIG. 2, mirrors 124, 126 have an angular orientation. Transverse lens barrel 122 is made of a material having a low coefficient of thermal expansion. For example, the coefficient of thermal expansion may be as low as 6 ppm/° C. or below. Some materials having this property include alumina ceramic ($Al_2O_3$), Invar, Ultra Low Expansion™ glass, Zerodur glass, and silicon carbide (SiC). For example, the coefficient of thermal expansion may be as low as 6 ppm/° C. or below. A coefficient of thermal expansion of a material represents a characteristic of the material in response to thermal changes, and is measured in parts per million for every centigrade of temperature gradient. Table I below shows some examples of materials having this property.

TABLE 1

| Materials | Coefficient of Thermal Expansion |
| --- | --- |
| Alumina ceramic ($Al_2O_3$) | 5.7 ppm/° C. |
| Invar | 0.64–3.11 ppm/° C. (depending on heat treatment) |
| ULE ™ glass | 0.03 ppm/° C. |
| Zerodur | 0.05 ppm/° C. |
| Silicon carbide (SiC) | 0.4–5.1 ppm/° C. (depending on temperature range) |

Also, consistent with the principles of the invention, a catadioptric lens barrel structure is provided with a support structure. The support structure is made of a material having a low coefficient of thermal expansion, such as the materials discussed above with respect to Table 1. The support structure includes an upper support platform and a lower support platform. The upper and lower support platforms run parallel to each other and are perpendicular to the first and second optical axes. Each support platform has a plurality of openings to accommodate the corresponding plurality of lens barrels. The upper support platform firmly secures the first lens barrel as near the first optical pivot point as possible. A first set of flexures resiliently secure the second lens barrel around a corresponding opening to the upper support platform. The lower support platform firmly secures the second lens barrel as near the second optical pivot point as possible. A second set of flexures resiliently secures the first lens barrel around a corresponding opening to the lower support platform.

Figure 5:
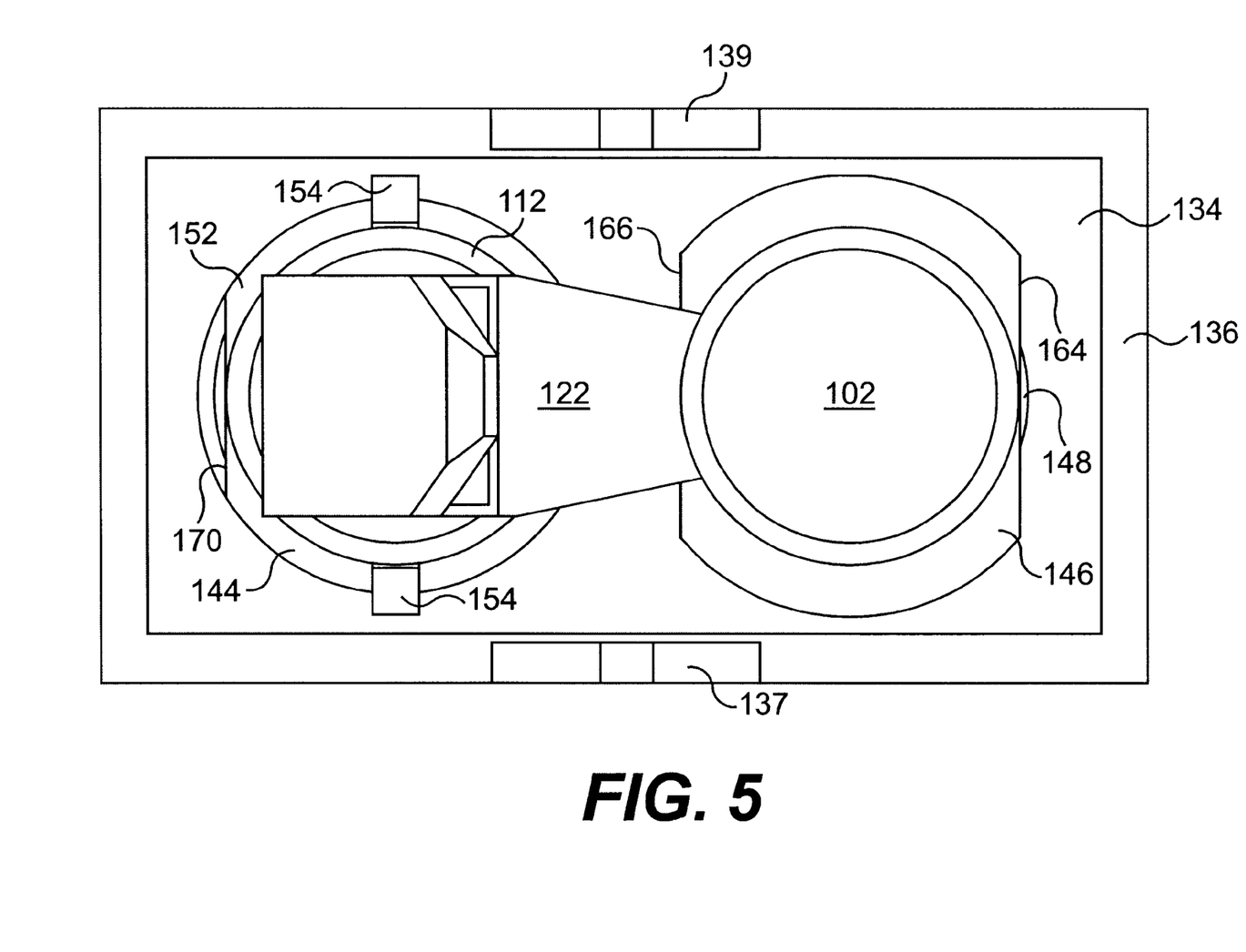
FIG. 5 is a top view of the catadioptric lens barrel structure according to the first embodiment of the present invention.

In the first embodiment, as illustrated in FIG. 1, support structure 132 includes an upper support platform 134, a lower support platform 136, a support panel 138, a support stand 140, a first lateral support 137, and a second lateral support 139 (shown in FIG. 5). Support structure 132, including upper and lower support platforms 134, 136, support panel 138, support stand 140, first and second lateral supports 137, 139, are preferably made of a material having a low coefficient of thermal expansion such as the materials discussed above with respect to Table 1.

Using low expansion materials for support structure 132 and transverse lens barrel 122 minimizes errors related to distortion of the catadioptric lens barrel structure 100 due to temperature changes. For example, distortion may result from the changing distance between first and second lens barrels 102 and 112. As such, the distance between first and second lens barrels 102, 112, is a key parameter of this type of catadioptric lens barrel structure. This distance according to the first embodiment of this invention is approximately 520 mm (about 20 inches). When temperature increases or decreases, the plurality of lens barrels 102, 112, transverse lens barrel 122, and the support structure 132 expand or contract according to the coefficient of thermal expansion of its individual part. Using materials having extremely low coefficient of thermal expansion substantially reduces errors caused by temperature changes. Therefore, upper and lower support platforms 134, 136, along with transverse lens barrel 122 substantially maintain the distance D regardless of temperature changes. In one embodiment, support panel 138, support stand 140, and first and second lateral supports 137, 139, are made of one of the materials selected from Table 1 so that they will expand or contract, if at all, at the same rate, thus keeping first and second lens barrels 102, 112 parallel. Although not required, transverse lens barrel 122 may be made of the same material as for upper and lower support platforms 134, 136. If transverse lens barrel 122 is made of a different material than that for the upper or lower support platforms 134, 136, then an adjustment mechanism will be needed to compensate for the differences in materials.

Upper support platform 134 is horizontally positioned perpendicular to optical axes 104, 114, and is positioned as near to first optical pivot point 106 as possible. Lower support platform 136 runs parallel to upper support platform 134, and perpendicular to optical axes 104, 114. Lower support platform 136 is positioned as near to second optical pivot point 116 as possible. The purpose of such construction is to minimize errors related to distortion of the catadioptric lens barrel structure 100 due to vibrational motion. Computer generated model and/or computer analysis may be used to determine the locations of these first and second optical pivot points 106, 116. Thus, first and second optical pivot points 106, 116 indicate optimum points to hold first and second lens barrels 102, 112 that minimize swinging motion or pendulum effects of the lens barrels.

FIG. 2 illustrates the path of exemplary light beam 128 through lens barrel structure 100 as discussed briefly with respect to FIG. 1. Light source 130 illuminates reticle 108. Reticle 108 is shown as placed on an image plane 109. Light source 130 enters first lens barrel 102. A reflective element 110, such as a mirror, is provided and positioned in front of an exit end 105 of first lens barrel 102 on an opposing end of reticle 108. Mirror 110 preferably has an optical axis which is aligned with first optical axis 104. Light beam 128 is reflected off of mirror 110, illustrated as light beam 128'. Light beam 128' travels back through first lens barrel 102. Light beam 128' then hits mirror 124 carried inside transverse lens barrel 122, is reflected off of mirror 124, as light beam 128", and is reflected off of mirror 126, as light beam 128'". Light beam 128'" travels through second lens barrel 112 and hits wafer 118. Mirrors 124 and 126 are preferably oriented at 45° angle from light beams 128' and 128", respectively. Therefore, in this embodiment if imaginary extension lines 125 and 127 are drawn from mirrors 124 and 126, respectively, it will be shown that mirrors 124 and 126 are perpendicular to each other.

Figure 3:
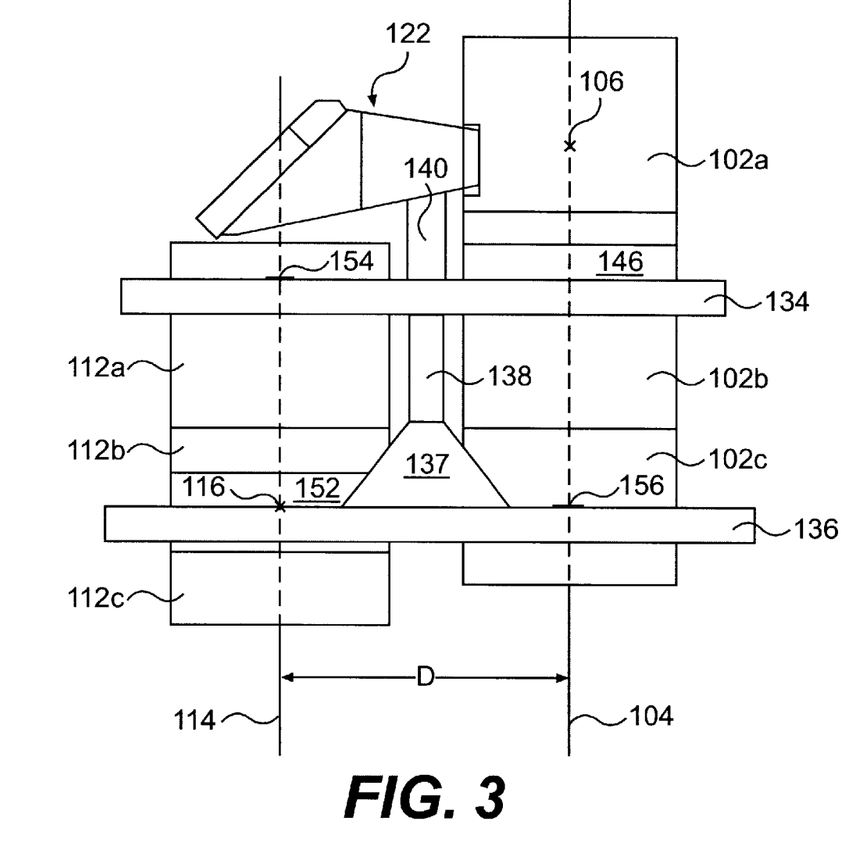
FIG. 3 is a front view of the catadioptric lens barrel structure according to the first embodiment of the present invention.
Figure 4:
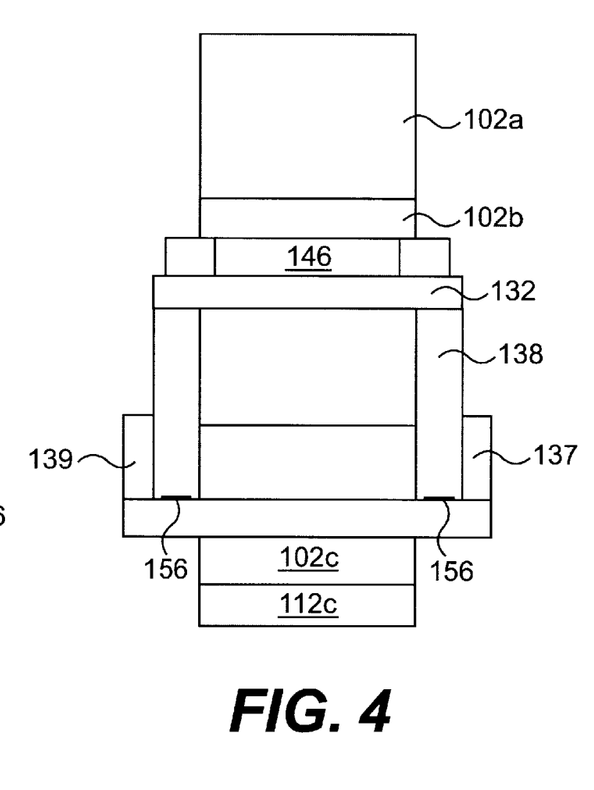
FIG. 4 is a side view of the catadioptric lens barrel structure according to the first embodiment of the present invention.

FIGS. 3, 4, and 5 show front, side, and top views, respectively, of the catadioptric lens barrel structure. Upper support platform 134 has first and second openings, 142 (not shown), 144 to accommodate upper portions of first and second lens barrels, 102, 112, respectively. First and second openings 142, 144 are slightly larger in diameter to provide clearance allowing first and second lens barrel 102 and 112, respectively, to expand and contract. A first flange 146 is provided around first opening 142 to firmly secure first lens barrel 102 to upper support platform 134. Similarly, lower support platform 136 has first and second openings, 148, 150 to accommodate lower portions of first and second lens barrels, 102 and 112, respectively. First and second openings 148, 150 are slightly larger in diameter than the lens barrels to allow first and second lens barrels 102 and 112, respectively, to expand and contract. A second flange 152 is provided around second opening 150 to firmly secure second lens barrel 112 to lower support platform 136. Flange 146 has a circular shape and may have segment cuts on two opposing edges 164 and 166. Flange 152 is constructed similarly. The segment cuts facilitate a more compact structural design by positioning first and second lens barrels 102, 112 closer together. First and second flanges 146, 152 may be fastened to upper and lower support platforms 134, 136, respectively, by a series of bolts (not shown) or other types of fasteners.

Upper support platform 134 has a set of flexures 154 attached thereto around second opening 144 to resiliently secure second lens barrel 112 to upper support platform 134. Lower support platform 136 has a set of flexures 156 attached thereto around first opening 148 to resiliently secure first lens barrel 102 to lower support platform 136. In one embodiment, flexures 156, 154 are located on opposing peripheries of openings 148, 144, respectively, and may also be positioned aligned with imaginary optical planes 158, 159 (see FIG. 1), respectively. First optical plane 158 is defined as a plane perpendicular to frontal plane 120 running across first optical axis 104. Second optical plane 159 is defined as a plane perpendicular to frontal plane 120 running across second optical axis 114. The purpose of such a flexure arrangement is to keep distance D constant.

Lens barrel structure according to the first aspect of the invention provides an advantageous structural arrangement for optical performance purposes because upper and lower support platforms 134, 136, firmly secure first and second lens barrels 102, 112, respectively, around optical pivot points 106, 116, respectively. However, if first and second lens barrels 102, 112 are large and heavy, they might be very difficult to support. It may also be difficult to support upper and lower support platforms 134, 136, around optical pivot points 106, 116. Therefore, a second embodiment of the present invention is directed to a base mounting support structure which, from a mechanical stand point, provides an optimal support to the first and second lens barrels. The support structure according to the second embodiment includes a base support platform which firmly secures the first and second embodiment around their base portions. For a structural reason, this type of base mounting support structure is easier to build.

In accordance with the second embodiment, similar to the first embodiment, a catadioptric lens barrel structure is provided with a plurality of lens barrels. Each lens barrel has an optical axis running along the length of its corresponding lens barrel, the optical axes being in parallel and defining a frontal plane.

Figure 6:
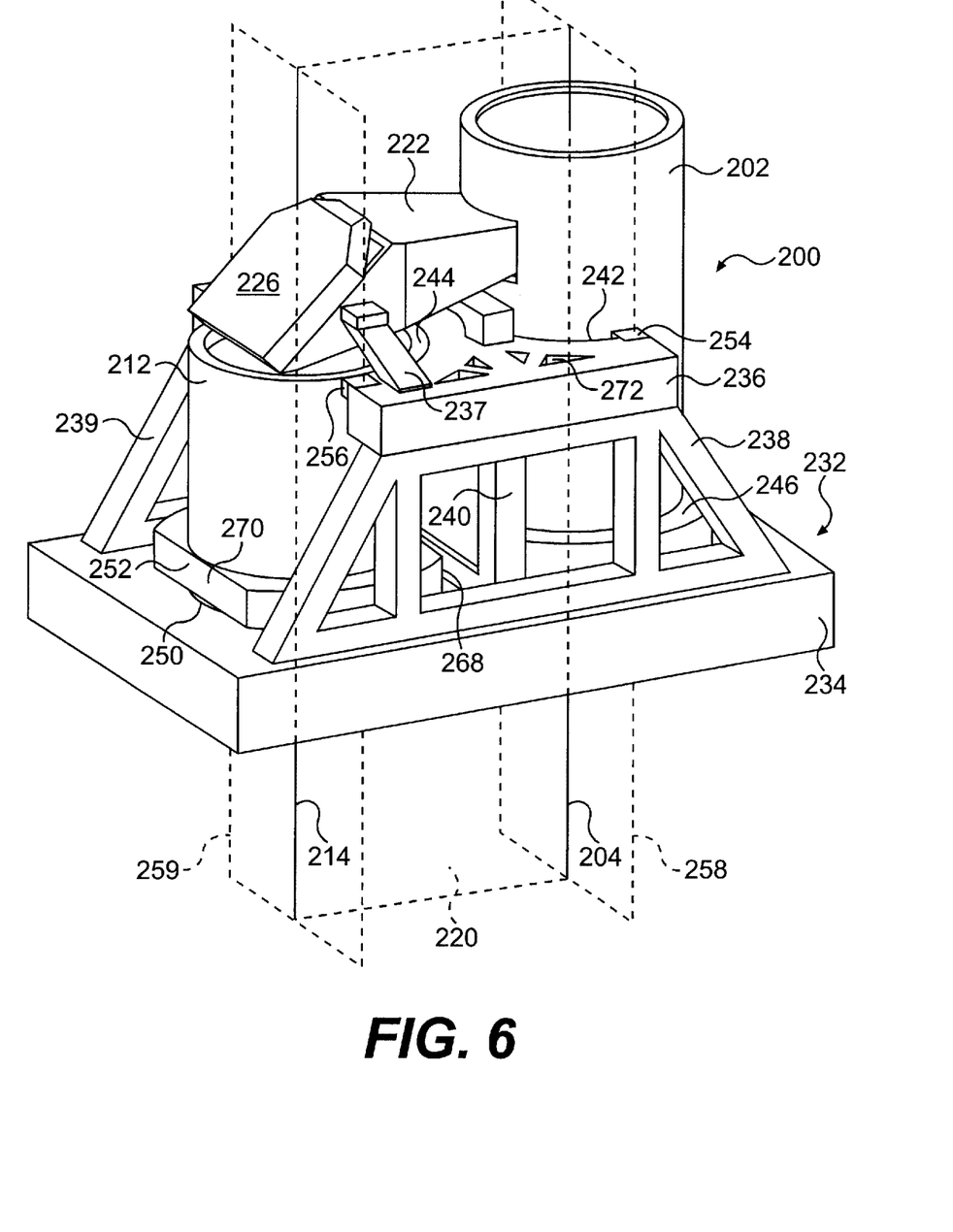
FIG. 6 is a perspective view of a catadioptric lens barrel structure according to a second embodiment of the present invention.

FIG. 6 illustrates the second embodiment, wherein a catadioptric lens barrel structure, designated by the reference numeral 200 comprises, for exemplary purposes, a pair of lens barrels including a first lens barrel 202 and a second lens barrel 212. First lens barrel 202 has a first optical axis 204 running along its length. Similarly, second lens barrel 212 has a second optical axis 214 running along its length. First and second optical axes 204, 214 run parallel to each other and define a frontal plane 220. As explained above with respect to the first embodiment, first and second lens barrels 202, 212 can also be made of a rigid material, such as silicon carbide or stainless steel, for example SS 17-7PH, SS 440 series, or SS 300 series.

Consistent with the principles of the invention, the second embodiment includes a catadioptric lens barrel structure having at least one transverse lens barrel. The number of transverse lens barrels equals to the number of lens barrels minus one. The transverse lens barrels connect one of the plurality of lens barrels to the next successive lens barrel. Each transverse lens barrel includes at least a pair of reflective elements. The reflective elements are angularly oriented to reflect an image from one lens barrel to the next successive one. In a semiconductor environment, the image is from a reticle and the image is passed through successive lens barrels until it finally reaches a semiconductor wafer in front of an exit end of the last lens barrel.

As shown in FIG. 6, catadioptric lens barrel structure 200 includes, for exemplary purposes, a transverse lens barrel 222 connecting first lens barrel 202 to second lens barrel 212. Transverse lens barrel 222 carries therein a first mirror and a second mirror 226. The first mirror is hidden by first lens barrel 202 in FIG. 6. The mirrors have an angular orientation. Transverse lens barrel 222 is made of a material having a low coefficient of thermal expansion. For example, the coefficient of thermal expansion may be as low as 6 ppm/° C. or below. The same selection of materials from Table 1 above apply for the second embodiment.

Also consistent with the principles of the invention, the second embodiment of the catadioptric lens barrel structure is provided with a support structure. The support structure is made of a material having a low coefficient of thermal expansion. The support structure includes a base platform and an upper support platform that run parallel to each other and are perpendicular to the first and second optical axes. Each platform has openings to accommodate the respective lens barrels. The base platform firmly secures base portions of the lens barrels. A plurality sets of flexures resiliently secure upper portions of the lens barrels to the upper support platform.

Figure 9:
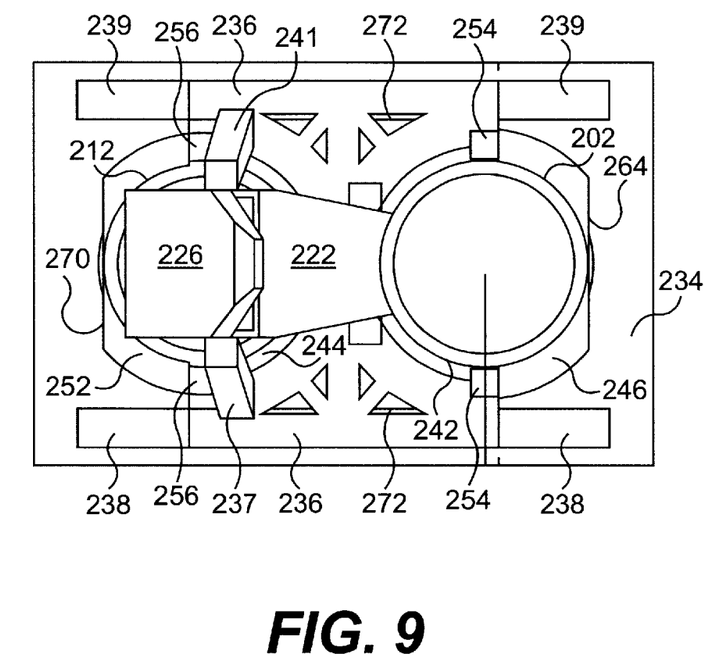
FIG. 9 is a top view of the catadioptric lens barrel structure according to the second embodiment of the present invention.

In the second embodiment and as illustrated in FIG. 6, support structure 232 includes a base platform 234, an upper support platform 236, a pair of trusses 238, 239 (shown in FIG. 9), a support stand 240, and a pair of support arms 237, 241 (also shown in FIG. 9). Base and upper support platforms 234, 236 run parallel to each other and are perpendicular to first and second optical axes, 204, 214. Base platform 234 is preferably thicker than upper support platform 236 to provide sufficient strength to support base portions of first and second lens barrels 202, 212.

Support structure 232, including base platform 234 and upper support platform 236, trusses 238, 239, support stand 240, and support arms 237, 241, are preferably made of a material having a low coefficient of thermal expansion. For example, the coefficient of thermal expansion may be as low as 6 ppm/° C. or below. Transverse lens barrel 222 is also preferably made of a material having a low coefficient of thermal expansion, more preferably 6 ppm/° C. or below. Table 1 above shows examples of materials having this property.

Figure 7:
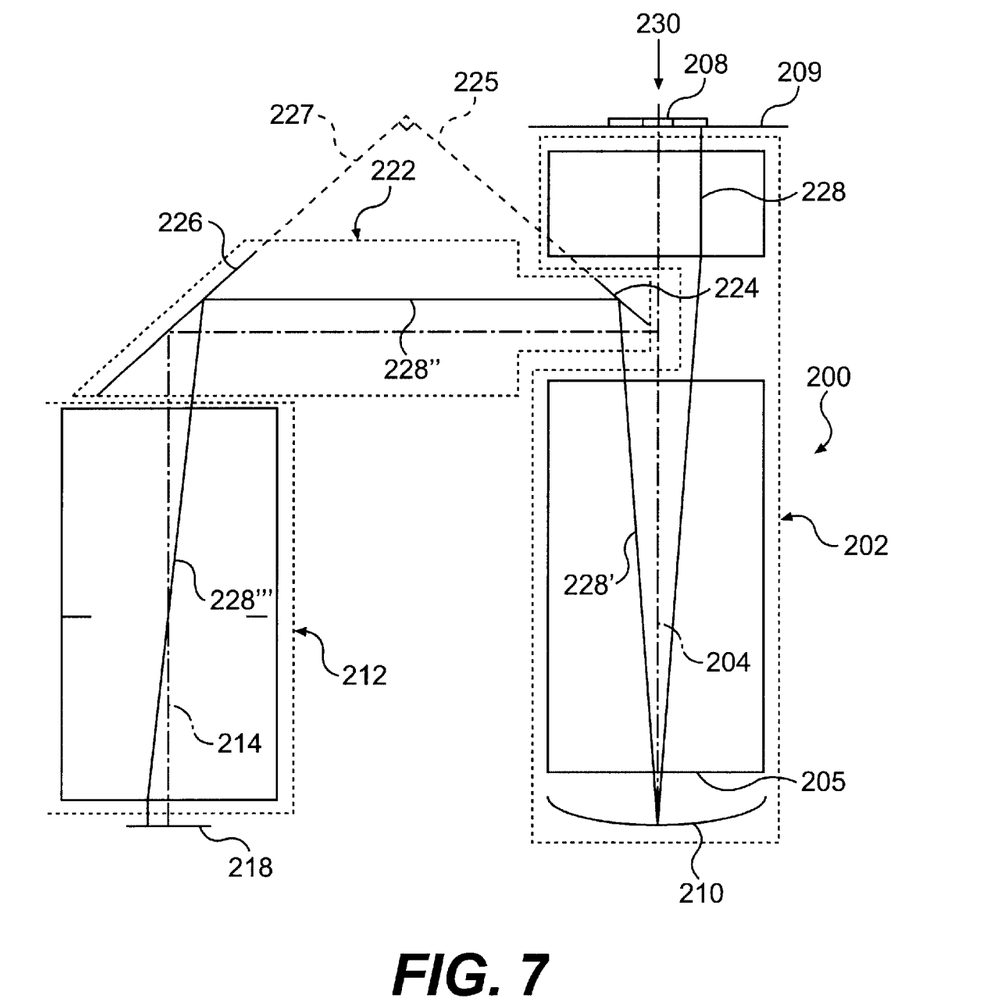
FIG. 7 is a schematic diagram of the catadioptric lens barrel structure according to the second embodiment of the present invention illustrating light path passing through the lens barrel structure.

FIG. 7, similar to the first embodiment shown in FIG. 2, illustrates the path of light beam 228 through lens barrel structure 200 as discussed with respect to FIG. 6. Light source 230 illuminates reticle which is placed on an image plane 209. Light beam 280 enters first lens barrel 202. A reflective element 210 is provided in front of an exit end 205 of first lens barrel 202 on the opposing end of first lens barrel 202 from reticle 208. Light beam 228 is reflected off of mirror 210, as light beam 228'. Light beam 228' travels back through first lens barrel 202. Light beam 228' then hits the first mirror carried inside transverse lens barrel 222, is reflected off of mirror 224, as light beam 228". Light beam 228" is reflected off of mirror 226, as light beam 228"'. Light beam 228"' travels through second lens barrel 212 and hits semiconductor wafer 218. The first mirror and second mirror 226 are preferably oriented at 45° angle from light paths 228' and 228", respectively. Therefore, if imaginary extension lines 225 and 227 are drawn from mirrors 224 and 226, respectively, it will be shown that mirrors 224 and 226 are perpendicular to each other.

Figure 8:
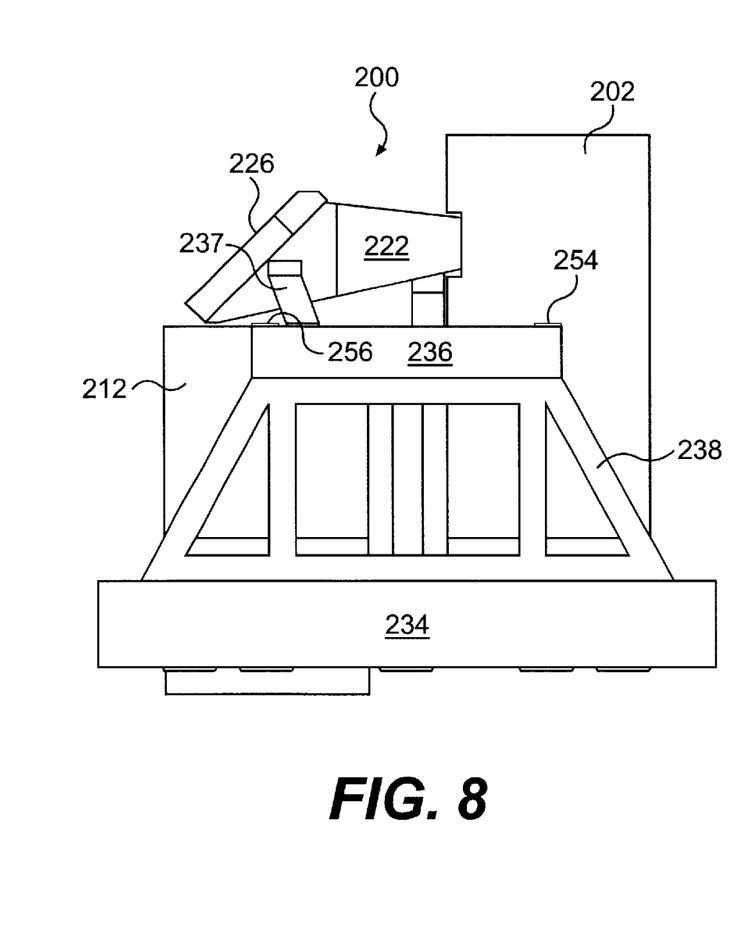
FIG. 8 is a front view of the catadioptric lens barrel structure according to the second embodiment of the present invention.
Figure 10:
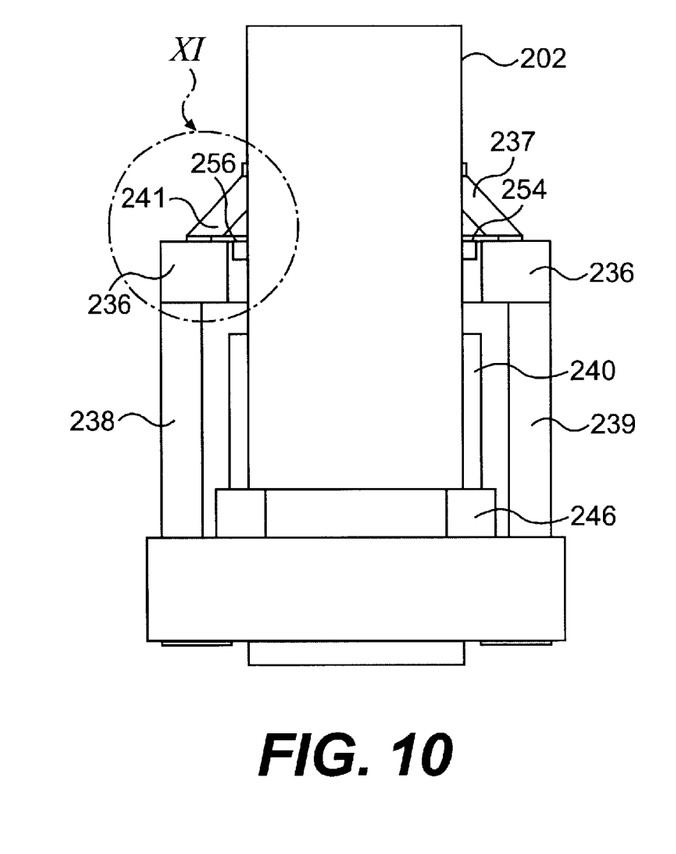
FIG. 10 is a side view of the catadioptric lens barrel structure according to the second embodiment of the present invention.

FIGS. 8, 9, and 10 show front, top, and side views, respectively, of the catadioptric lens barrel structure. Base platform 234 has first opening (not shown) and a second opening 250 (best shown in FIG. 6) to accommodate base portions of first and second lens barrels, 202 and 212, respectively. The first and second openings are slightly larger in diameter to allow first and second lens barrels 202, 212, respectively, to expand and contract. First and second flanges 246, 252 are provided around first and second openings 248, 250, respectively, to firmly secure first and second lens barrels 202, 212, respectively, to base platform 234. Flange 246 has a circular shape and may have segment cuts on two opposing edges. FIG. 9 shows edge 264, the opposing edge is covered by upper support platform 236. Similarly, flange 252 has a circular shape and may have segment cuts on two opposing edges. Edge 270 is shown, the corresponding opposing edge is covered by upper support platform 236. The segment cuts facilitate a more compact structural design by positioning first and second lens barrels 202, 212 closer together. First and second flanges 246, 252 may be fastened to base support platform 234 by a series of bolts (not shown) or other types of fasteners.

Upper support platform 236 has a first opening 242 and a second opening 244 to accommodate upper portions of first and second lens barrels, 202 and 212, respectively. First and second openings 242, 244, respectively, are shown having semi-circular cuts to reduce the weight of upper support platform 236. In addition, upper support platform 236 may also include mold cutouts 272 to further reduce its weight. Upper support platform 236 has a plurality of flexures 254 attached thereto around first opening 242 to resiliently secure first lens barrel 202 to upper support platform 236. Alternatively, upper support platform 236 may also have a plurality of flexures 256 attached thereto around second opening 244 to resiliently secure second lens barrel 212 to upper support platform 236. Lens barrel structure 200 may dispense with flexures 256 because second lens barrel 212 is smaller in size and weighs less than first lens barrel 202.

When lens barrel structure 200 employs both sets of flexures 254, 256, the flexures are located on opposing peripheries of openings 242, 244, respectively, and are advantageously positioned aligned with first and second optical planes 258, 259 (see FIG. 6), respectively. First optical plane 258 is defined as a plane which is perpendicular to frontal plane 220 and runs across first optical axis 204. Second optical plane 260 is defined as a plane which is perpendicular to frontal plane 220 and runs across second optical axis 214.

Figure 11:
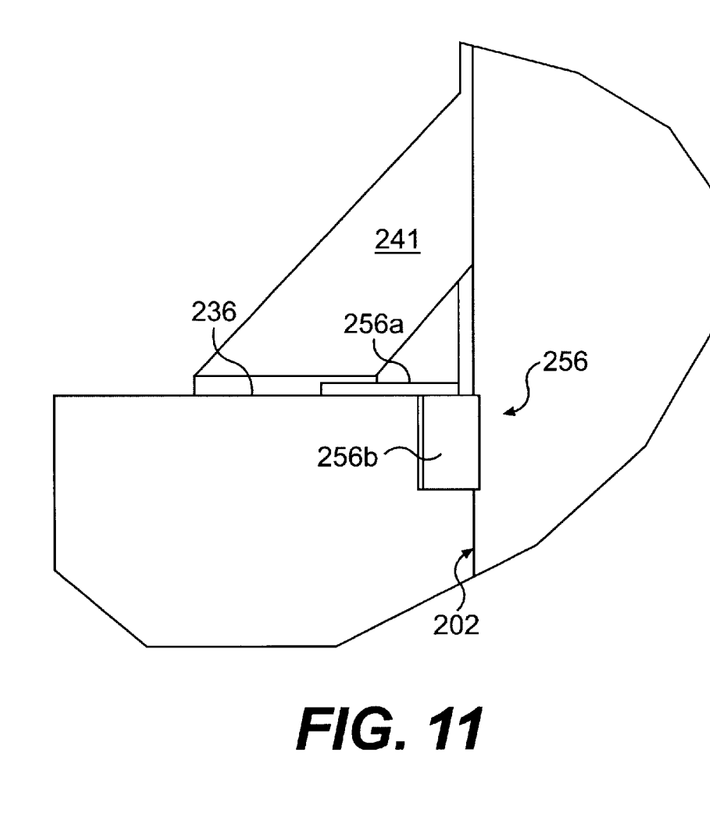
FIG. 11 is a detail view of a flexure for the lens barrel structure of the present invention taken from portion XI of FIG. 10.

FIG. 11 shows a detail view of flexures 256 according to the second embodiment. Flexures 254 and 256 comprise flexing plates 254a, and 256a, respectively, and mounting plates 254b and 256b, respectively. Flexing plates 254a, 256a attach flexures 254, 256 to upper support platform 236. Mounting plates 254b, 256b attach flexures 254, 256 to first and second lens barrels 202, 212, respectively. Flexures 254, and 256 have several characteristics, including: one, ability to constrain lens barrels 202, 212 from rotating around optical axes 204, 214, respectively; two, sufficient flexibility allowing lens barrels 202, 212 to linearly expand or contract along optical axes 204, 214, respectively; and three, sufficient flexibility allowing lens barrels 202, 212 to radially expand or contract perpendicular to optical axes 204, 214, respectively. The widths W of flexures 254, 256 constrain rotational movement of lens barrels 202, 212 around optical axes 204, 214, respectively. Flexures 254, 256 are preferably made of stainless steel. Other materials having similar characteristics may also be used.

Flexures 154, 156 of FIG. 1 have the same construction and characteristics as flexure 256 described above. Therefore, flexures 154, 156 include mounting plates, and flexures 154, 156 are attached to support platforms 134, 136, respectively, and lens barrels 112, 102, respectively. The characteristics discussed above with respect to flexures 256 apply as well to flexures 154, 156.

Figure 12:
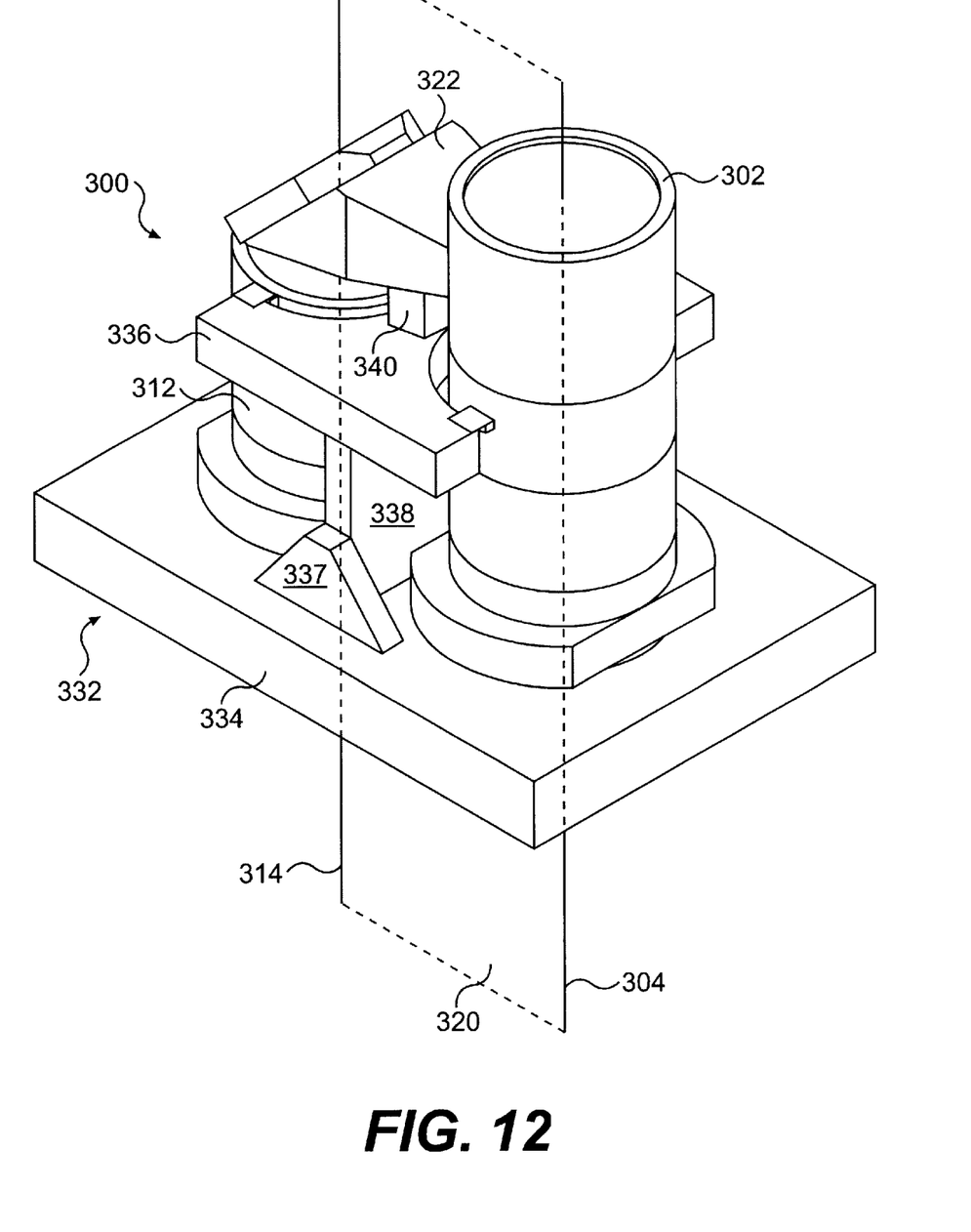
FIG. 12 is a perspective view of a catadioptric lens barrel structure according to a third embodiment of the present invention.

A third embodiment is also directed to a base mounting support structure. The support structure according to the third embodiment is a variation of the support structure according to the second embodiment. In the third embodiment, as illustrated in FIG. 12, a catadioptric lens barrel structure 300 comprises a first lens barrel 302, a second lens barrel 312, and a transverse lens barrel 322. First and second lens barrels 302, 312, and transverse lens barrel 322 have the same structural arrangement as the second embodiment shown in FIG. 6. First lens barrel 302 has a first optical axis 304 running along its length. Second lens barrel 312 has a second optical axis 314 running along its length. First and second optical axes 304, 314 run parallel to each other and together define a frontal plane 320.

Lens barrel structure 300 also comprises a support structure 332. Support structure 332 is a variation of support structure 232 shown in the second embodiment. Support structure 332 includes a base support platform 334, an upper support platform 336, a support panel 338, a support stand 340, and a first lateral support 337, and corresponding opposite second lateral support (not shown). Similar to support structure 232 of the second embodiment, base and upper support platforms 334, 336 run parallel to each other and are perpendicular to first and second optical axes 304, 314. Base support platform 334 is preferably thicker than upper support platform 336 to provide sufficient strength to support first and second lens barrels 302, 312. Support structure 332, including base support platform 334 and upper support platform 336, support panel 338, support stand 340, and lateral supports 337, 339, are preferably made of a material having a low coefficient of thermal expansion. For example, the coefficient of thermal expansion may be as low as 6 ppm/° C. or below. Transverse lens barrel 322 is also preferably made of a material having a low coefficient of thermal expansion, more preferably 6 ppm/° C.

Table 1 above shows examples of materials having this property.

Lens barrel structure 300 further comprises a plurality sets of flexures and flanges similar to those described with the first and second embodiments. Therefore, no further explanation detailing these features is provided.

It will be apparent to those skilled in the art that various modifications and variations can be made in the catadioptric lens barrel structure, the material chosen for the present invention, and in construction of the number of lens barrels arrangement and the support structure as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. A lens barrel structure, comprising:
   a plurality of lens barrels;
   at least one transverse lens barrel connecting a lens barrel;
   a support structure to support the plurality of lens barrels; and
   a plurality of flexures to resiliently secure the plurality of lens barrels to the support structure.

2. The lens barrel structure of claim 1, wherein the support structure is made of a material having a coefficient of thermal expansion of 6 ppm/° C. or below.

3. The lens barrel structure of claim 2, wherein the material is selected from the group consisting of alumina ceramic, Ultra Low Expansion™ glass, Zerodur glass, silicon carbide, and Invar.

4. The lens barrel structure of claim 1, wherein each lens barrel has an optical axis running along the length of the corresponding lens barrel, and wherein each set of flexures has characteristics of being:
   sufficiently firm in confining rotational movement of the corresponding lens barrel around the corresponding optical axis;
   sufficiently soft in allowing linear movement of the corresponding lens barrel along the corresponding optical axis; and
   sufficiently soft in allowing radial movement of the corresponding lens barrel perpendicular to the corresponding optical axis.

5. The lens barrel structure of claim 1, wherein the at least one transverse lens barrel comprises a pair of reflective elements.

6. The lens barrel structure of claim 5, wherein the at least one transverse lens barrel and the support structure are made of materials having coefficients of thermal expansion of 6 ppm/° C. or below.

7. The lens barrel structure of claim 6, wherein the materials are selected from the group consisting of alumina ceramic, Ultra Low Expansion™ glass, Zerodur glass, silicon carbide, and Invar.

8. A lithography system comprising a lens barrel structure as claimed in claim 1.

9. A lens barrel structure, comprising:
   a plurality of lens barrels;
   a support structure to support the plurality of lens barrels;
   a plurality of flexures to resiliently secure the plurality of lens barrels to the support structure; and at least one reflective element positioned in front of an exit end of a lens barrel.

10. A lens barrel structure, comprising:
    a plurality of lens barrels, each of the plurality of lens barrels comprising an optical axis and an optical pivot point along the optical axis;
    a support structure to support the plurality of lens barrels, the support structure comprising a plurality of support platforms, each support platform firmly securing the corresponding lens barrel substantially near the corresponding optical pivot point; and
    a plurality of flexures to resiliently secure the plurality of lens barrels to the support structure.

11. The lens barrel structure of claim 10, wherein the support platforms are parallel to each other and perpendicular to the optical axes.

12. A lens barrel structure, comprising:
    a plurality of lens barrels;
    a support structure to support the plurality of lens barrels, the support structure comprising a base support platform firmly securing base portions of the lens barrels and an upper support platform; and
    a plurality sets of flexures resiliently securing upper portions of the lens barrels to the upper support platform of the support structure.

13. A lens barrel structure, comprising:
    a plurality of lens barrels, each lens barrel having an optical axis running along the length of the lens barrel, a frontal plane being defined by a plane passing through the plurality of optical axes, and a plurality of optical planes being defined by planes each perpendicular to the frontal plane and passing through a respective optical axis;
    a support structure to support the plurality of lens barrels, the support structure further comprising a plurality of support platforms parallel to each other and perpendicular to the optical axes, each support platform having openings to accommodate the plurality of lens barrels; and
    a plurality of flexures to resiliently secure the plurality of lens barrels to the support structure, each flexure being attached opposite another flexure on a periphery of a selected one of the openings and being aligned with the corresponding selected one of the optical planes.

14. A method for making a lens barrel structure, comprising:
    providing a plurality of lens barrels;
    providing at lease one transverse lens barrel connecting a lens barrel;
    providing a support structure to support the plurality of lens barrels; and providing flexures to resiliently secure the plurality of lens barrels to the support structure.

15. The method of claim 14, wherein the support structure is made of a material having a coefficient of thermal expansion of 6 ppm/° C. or below.

16. The method of claim 15, wherein the material is selected from the group consisting of alumina ceramic, Ultra Low Expansion™ glass, Zerodur glass, silicon carbide, and Invar.

17. The method of claim 14, wherein the step of providing a plurality of lens barrels further comprises a step of:
defining a plurality of parallel optical axes, each running along the length of a corresponding one of the lens barrels.

18. The method of claim 17, wherein the step of providing a support structure further comprises a step of:
maintaining the plurality of optical axes substantially parallel and substantially the same distance from each other.

19. The method of claim 17, wherein the step of providing a plurality of lens barrels further comprises a step of defining an optical pivot point of each respective lens barrel along the corresponding optical axis, and the step of providing a support structure further comprises a step of supporting each of the lens barrel substantially near the corresponding optical pivot point.

20. The method of claim 17, wherein the step of providing flexures further comprises the steps of:
confining rotational movement of the corresponding lens barrels around the corresponding optical axes;
allowing linear movement of the corresponding lens barrels along the corresponding optical axes; and
allowing radial movement of the corresponding lens barrels perpendicular to the corresponding optical axes.

21. The method of claim 17, wherein:
the step of providing a plurality of lens barrels further comprises a step of defining a frontal plane passing through the plurality of optical axes, and a step of defining a plurality of optical planes perpendicular to the frontal plane and passing through the corresponding optical axes; and
the step of providing a support structure further comprises a step of providing a plurality of support platforms parallel to each other and perpendicular to the optical axes, each support platforms having a plurality of openings to respectively accommodate the plurality of lens barrels.

22. The method of claim 21, wherein the step of providing flexures comprises a step of:
attaching a flexure opposite another flexure on a periphery of a selected one of the plurality of openings, and aligning each flexure with a corresponding optical plane.

23. A method of making a lens barrel structure, comprising: providing a plurality of lens barrels;
providing a support structure to support the plurality of lens barrels; and
providing flexures to resiliently secure the plurality of lens barrels to the support structure,
wherein the step of providing a support structure further comprises a step of providing a base support platform firmly supporting base portions of the lens barrels and an upper support platform, and
wherein the step of providing flexures comprises a step of securing upper portions of the lens barrels to the upper support platform.

* * * * *

UNITED STATES PATENT AND TRADEMARK OFFICE
CERTIFICATE OF CORRECTION

PATENT NO. : 6,473,245 B1
DATED : October 29, 2002
INVENTOR(S) : Marc Spinali

It is certified that error appears in the above-identified patent and that said Letters Patent is hereby corrected as shown below:

Column 12,
Line 64, "lease" should read -- least --.

Column 13,
Line 25, "barrel" should read -- barrels --.

Column 14,
Line 11, "platforms" should read -- platform --.

Signed and Sealed this

Fourth Day of March, 2003

JAMES E. ROGAN
*Director of the United States Patent and Trademark Office*